United States Patent
Tagami et al.

(10) Patent No.: US 6,885,063 B2
(45) Date of Patent: Apr. 26, 2005

(54) SEMICONDUCTOR DEVICE HAVING AN SEB VOLTAGE SUITABLE FOR USE IN SPACE

(75) Inventors: Saburo Tagami, Matsumoto (JP); Takashi Kobayashi, Matsumoto (JP); Fumiaki Kirihata, Matsumoto (JP); Satoshi Kuboyama, Tokyo (JP)

(73) Assignees: Fuji Electric Co., Ltd., Kanagawa (JP); National Space Development Agency of Japan, Ibaraki (JP)

( * ) Notice: Subject to any disclaimer, the term of this patent is extended or adjusted under 35 U.S.C. 154(b) by 70 days.

(21) Appl. No.: 10/366,946

(22) Filed: Feb. 14, 2003

(65) Prior Publication Data

US 2003/0218210 A1 Nov. 27, 2003

(30) Foreign Application Priority Data

May 21, 2002 (JP) ..................... P2002-145902

(51) Int. Cl.[7] .............................................. H01L 29/78
(52) U.S. Cl. ....................................................... 257/341
(58) Field of Search ................................ 257/327–330, 257/335, 339, 341, 342, 401; 438/270

(56) References Cited

U.S. PATENT DOCUMENTS

| | | | | |
|---|---|---|---|---|
| 5,674,766 A | * | 10/1997 | Darwish et al. | 438/270 |
| 5,897,355 A | * | 4/1999 | Bulucea et al. | 438/273 |
| 6,239,463 B1 | * | 5/2001 | Williams et al. | 257/328 |
| 6,621,121 B1 | * | 9/2003 | Baliga | 257/330 |

OTHER PUBLICATIONS

Saburo Tagami, Takashi Kobayashi, Humiaki Kirihata, Shuji Somekawa and Satoshi Kuboyama, "3 Dimensional Device Simulation for Single–Event–Burnout (SEB) of Space Use Power–MOSFETs", Fuji Electric Co., Ltd., Matsumoto Factory, Fuji Hitachi Power Semiconductor Co., Ltd., and National Space Development Agency of Japan, Tsukuba Space Center, IEE Japan, Oct. 25, 2001, pp. 41–46.

* cited by examiner

Primary Examiner—Carl Whitehead, Jr.
Assistant Examiner—Jennifer M Dolan
(74) Attorney, Agent, or Firm—Pearne & Gordon LLP

(57) ABSTRACT

In a power MOSFET, on an $N^+$ drain layer 21 as a substrate, a second N base layer 3 and a first $N^-$ base layer 22 are deposited in the order by epitaxial growth. In a surface portion of the layer 22, there are selectively formed a P base region 23, in a surface portion of which an $N^+$ source region 24 is selectively formed. On a channel region in the P base region 23, a gate electrode 26 is formed with a gate insulator film 25 held between. A source electrode 27 and a drain electrode 28 are formed on the $N^+$ source region 24 and on the back of the substrate, respectively. The layer 3 is made to have a thickness equal to or more than ¼ of that of the first $N^-$ base layer 22, and an averaged impurity concentration between $1\times10^{15}/cm^3$ and $3\times10^{17}/cm^3$. The thickness can be alternatively given as equal to or more than ½ of a difference between the thickness x shown as $x(\mu m)=V_{SEB}(V)/8$ and that of the layer 22, where $V_{SEB}$ is an SEB(Single Event Burnout) voltage of the layer 3. This makes positive feed back hard to occur between latch-up of a parasitic npn transistor and dynamic avalanche near the substrate to enhance the SEB voltage, allowing the MOSFET to be applied to space use.

3 Claims, 5 Drawing Sheets

SEMICONDUCTOR DEVICE HAVING AN SEB VOLTAGE SUITABLE FOR USE IN SPACE

BACKGROUND OF THE INVENTION

1. Field of the Invention

The present invention relates to a semiconductor device and, more particularly to a semiconductor device forming a power MOSFET having high cosmic rays radiation hardness.

2. Description of the Related Art

The power MOSFET is widely used as a switching device in a system such as a power supply, a motor driving circuit, or a control circuit. In mounting the power MOSFET on a space rocket or a satellite, it is necessary to prevent the power MOSFET from failure due to entering high-energy heavy ion particles arrived from the space. This necessitates use of a power MOSFET in which a voltage at such failure, i.e. Single Event Burnout, SEB, (hereinafter referred to as SEB voltage) is high.

FIG. 1 is a cross sectional view showing an arrangement of an n-channel power MOSFET traditionally used. In the power MOSFET, on a drain layer 11 of $N^+$ semiconductor substrate, an $N^-$ base layer 12 is deposited by epitaxial growth. In a portion on the surface of the $N^-$ base layer 12, there is selectively formed a P base region 13. Further, in a portion on the surface of the P base region 13, there is selectively formed an $N^+$ source region 14. In the P base region 13, there is also formed a highly doped $P^+$ base region covering a part of the $N^+$ source region 14. Showing the detail of the highly doped $P^+$ base region, however, is omitted from FIG. 1. In the P base region 13, a surface region between the $N^+$ source region 14 and the $N^-$ base layer 12 is made served as a channel region. On the channel region, a gate electrode 16 is formed with a gate insulator film 15 held between the channel region and the gate electrode 16. In addition, there is formed a source electrode 17 in contact with the $N^+$ source region 14 and the P base region 13 in common. On the back of the $N^+$ drain layer 11, there is formed a drain electrode 18.

An on-resistance of the power MOSFET with the arrangement shown in FIG. 1 is given as a sum of a resistance of the channel region, a resistance of the $N^-$ base layer 12, and a resistance of the $N^+$ drain layer 11. Of those resistances, the largest one is normally the resistance of the $N^-$ base layer 12. For suppressing switching loss as being the smallest possible, the smallest possible on-resistance is preferable. Therefore, the $N^-$ base layer 12 is designed to have the least sufficient thickness for keeping a specified breakdown voltage. Namely, in designing a power MOSFET, determination of a breakdown voltage $V_{BR}$ of a device almost determines an impurity concentration $N_D$ and the thickness of the $N^-$ base layer 12.

The relationship between the breakdown voltage $V_{BR}$ of the device and the impurity concentration $N_D$ of the $N^-$ base layer 12 is expressed by the following expression (1) with the junction approximated as being a step junction:

$$V_{BR}=(\epsilon \cdot \epsilon_0 (N_A+N_D)E_{BR}^2)/(2q \cdot N_A \cdot N_D) \quad (1)$$

where $N_A$ is the acceptor concentration in the P base region 13, $\epsilon_0$ is the permittivity of vacuum, $\epsilon$ is the relative dielectric constant of the semiconductor, q is the charge of electron is q, and $E_{BR}$ is the insulation breakdown electric field strength of the semiconductor (for Si, $3.25 \times 10^5$ V/cm).

For $N_A \gg N_D$, the above expression (1) is approximated by the following expression (2), from which the impurity concentration $N_D$ in the $N^-$ base layer 12 is determined.

$$V_{BR}=(\epsilon \cdot \epsilon_0 \cdot E_{BR}^2)/(2q \cdot N_D) \quad (2)$$

In addition, a width of a depletion layer on the side of the the $N^-$ base layer 12 is expressed by the following expression (3) as $$d=\sqrt{((2\epsilon \cdot \epsilon_0 \cdot V_{BR})/(q \cdot N_D))}=2V_{BR}/E_{BR} \quad (3)$$

The actual voltage withstanding design of the device is carried out on the basis of the expression (3) with some margin taken into consideration.

Incidentally, there are various kinds of patent applications about vertical MOSFETs improved for preventing damages of devices due to breakdown (JP-A-59-132671 and JP-A-60-196975).

However, when the power MOSFET with the arrangement as shown in FIG. 1 is applied to space use, there occurs a problem in that high energy heavy ion particles incident on the power MOSFET cause SEB even with an applied voltage of the order of ⅓ to ½ of the breakdown voltage. The SEB can be explained in detail as follows with a mechanism having been clarified by a three-dimensional device simulation.

That is, suppose that, with each of the drain and the gate being negatively biased with respect to the source, respectively, there is incident on the power MOSFET a cosmic ray of high energy heavy ion particles with a range R therein. The incident cosmic ray passes a top end of the $N^+$ source region 14 to reach the $N^+$ drain layer 11, during which the cosmic ray produces electron-hole pairs while losing its energy. A current produced by an incident beam of such cosmic ray sometimes locally exceeds 100,000A per square centimeter.

Produced electrons, being affected by an electric field, flow toward the $N^+$ drain layer 11. While, holes move toward the $N^+$ source region 14, passing through the P base region 13 to be taken out from the source electrode 17. The hole current exceeding a certain value makes the pn-junction between the $N^+$ source region 14 and the P base region 13 forward-biased to cause latch-up, by which electrons are injected from the $N^+$ source region 14. That is, a parasitic npn-transistor is made in being turned on. The injected electrons move along the incident beam path allowing a current to easily flow, and reach the $N^+$ drain layer 11, where the electrons cause dynamic avalanche, by which a large number of electron-hole pairs are produced.

Here, with $J_n$, $J_p$, $\alpha_n$, and $\alpha_p$ taken as values of an electron current and hole current, impact ionization rates of the electron and hole, respectively, each being a function of the electric field, a carrier pair generation rate G of the semiconductor is expressed by the following expression (4) as, $$G=\alpha_n \cdot J_n + \alpha_p \cdot J_p \quad (4)$$

In this case, the values of $J_n$ and $J_p$ are significantly large. Therefore, the value of the carrier pair generation rate G becomes large even in an electric field with an electric field strength far lower than the static insulation breakdown electric field strength (in silicon, $2 \times 10^5$ V/cm). That is, a large number of electron-hole pairs are to be produced. The produced holes flow toward the $N^+$ source region 14 again to enhance latch-up. This causes between the parasitic npn-transistor and the $N^+$ drain layer 11 a positive feedback similar to that in the thyristor mode, by which the current is promptly increased.

Thus, a high-density electron-hole plasma is maintained along the path of the incident beam to finally cause local thermal runaway that results in device breakdown. The time until occurrence of the positive feed back is normally of the order of 1000 picoseconds. In FIG. 2, there are shown examples of respective current waveforms obtained by simulations with and without occurrence of SEB.

In view of the above problem, the invention was made with an object of providing a semiconductor device which forms a power MOSFET provided with sufficient SEB voltage for being applied to space use.

SUMMARY OF THE INVENTION

In order to achieve the above object, the inventors carried out simulations about the relationship between the thickness of the total epitaxial layer (thickness from the $N^+$ semiconductor substrate to the surface) and the SEB voltage with impurity concentration in the $N^-$ base layer taken as a parameter. FIG. 3 is a diagram showing characteristics as one of the results of the simulation. It is shown that, even with impurity concentration in the $N^-$ base layer as a parameter is changed to be doubled from $5 \times 10^{14}/cm^3$ up to $1 \times 10^{15}/cm^3$, the SEB voltage is hardly changed. As a result, the following was made clear. As is apparent from FIG. 3, it is understood that the SEB voltage is hardly dependent on the impurity concentration in the $N^-$ base layer and increases with an increase in the thickness of the total epitaxial layer to exhibit a rapid increase when the thickness of the total epitaxial layer exceeds the range R of the cosmic ray (high-energy heavy ions) in silicon. This is because the above positive feedback becomes hard to occur as the thickness of the epitaxial layer increases. The invention, which will be explained in detail in the following, can be applied even to the case in which the cosmic rays pass through the silicon.

A triangular mark in FIG. 3 shows the result of a simulation carried out about a device in which epitaxial layers are provided in two layers and the impurity concentration in a first epitaxial layer near the surface is given as $1 \times 10^{15}/cm^3$ and the impurity concentration in a second epitaxial layer on the substrate side is given as $3 \times 10^{17}/cm^3$, with both of the epitaxial layers made to have the same thickness. From the above results, it is proved that the SEB voltage is almost determined by the total thickness of the epitaxial layers, and that the impurity concentration in the second epitaxial layer on the substrate side equal to $3 \times 10^{17}/cm^3$ or less causes little reduction in the SEB voltage. Therefore, in the arrangement of the traditionally used MOSFET shown in FIG. 1, by providing an N-type base layer with a relatively high impurity concentration between the $N^-$ base layer and the drain layer of the $N^+$ substrate, the SEB voltage can be far enhanced without increasing on-resistance so much.

The invention has been made on the basis of the above-explained findings and the semiconductor device according to the invention is characterized in that the device includes a first $N^-$ base region, a P base region selectively provided in a surface portion of the first $N^-$ base region, an $N^+$ source region selectively provided in a surface portion of the P base region, a $P^+$ base region provided so as to cover a part of the $N^+$ source region in the P base region, a second N base region in contact with the first $N^-$ base region and apart from the P base region, an $N^+$ drain region in contact with the second N base region and apart from the first $N^-$ base region, a gate insulator film provided along a channel region formed in the P base region between the first $N^-$ base region and the $N^+$ source region, a gate electrode holding the gate insulator film between the channel region and the gate electrode, a source electrode in contact with the $N^+$ source region and the P base region in common, and a drain electrode in contact with the $N^+$ drain region, in which device the second N base region has a thickness equal to or more than ¼ of the thickness of the first $N^-$ base region, and has an averaged impurity concentration between $1 \times 10^{15}/cm^3$ and $3 \times 10^{17}/cm^3$.

Here, the reason that the thickness of the second N base region is made equal to or more than ¼ of the thickness of the first $N^-$ base region is that such a thickness in a device with a class of rating voltage of 100V or more promises an SEB voltage enhanced by at least 50% or more compared with a device with a traditionally provided arrangement. Moreover, an upper limit of the thickness of the second N base region is taken as ten times as much as the thickness of the first $N^-$ base region. Furthermore, the reason that the averaged impurity concentration in the second N base region is made equal to or more than $1 \times 10^{15}/cm^3$ is that the impurity concentration less than the value increases the on-resistance to make the device unsuitable for practical application.

According to the invention, between the $N^-$ base region and the drain region made of $N^+$ semiconductor substrate, there is provided the second N base region having a thickness equal to or more than ¼ of the thickness of the first $N^-$ base region, and having an averaged impurity concentration between $1 \times 10^{15}/cm^3$ and $3 \times 10^{17}/cm^3$. This makes the positive feed back hard to occur between the latch-up of a parasitic npn transistor and dynamic avalanche near the substrate, by which the SEB voltage can be enhanced. Furthermore, in the surface portion of the channel region, a distance $\Delta L$ between a gate side end of the $P^+$ base region and a gate side end of the $N^+$ source region is made equal to or less than 0.6 $\mu m$, by which the pnp parasitic transistor becomes hard to operate to allow the SEB to be enhanced.

Alternatively, the second N base region is made to have an averaged impurity concentration between $1 \times 10^{15}/cm^3$ and $3 \times 10^{17}/cm^3$, and to have a thickness given as follows.

Namely, with respect to a linear expression $d_{max}=V1/12.5$ about a breakdown voltage V1 of the first $N^-$ base region mainly determining a breakdown voltage of the device and a maximum width $d_{max}$ of a depletion layer thereof, and a linear expression $d_{max}+d2=V_{SEB}/8$ about a single event burnout (SEB) voltage $V_{SEB}$ as cosmic rays radiation hardness of the second N base region and a thickness $d_{max}+d2$ from the depletion layer with the maximum width $d_{max}$ to the second N base region (where V1 and $V_{SEB}$ are in volts, and $d_{max}$ and d2 are in $\mu m$), with values of $d_{max}$ and $d_{max}+d2$ satisfying $V1=V_{SEB}$, the second N base region is made to have a thickness given as being equal to or more than one-half of $(d_{max}+d2)-d_{max}$, that is, one-half of d2 or more. This can enhance the SEB voltage without degrading on-resistance Ron.

DESCRIPTION OF THE PREFERRED EMBODIMENTS

Figure 4:
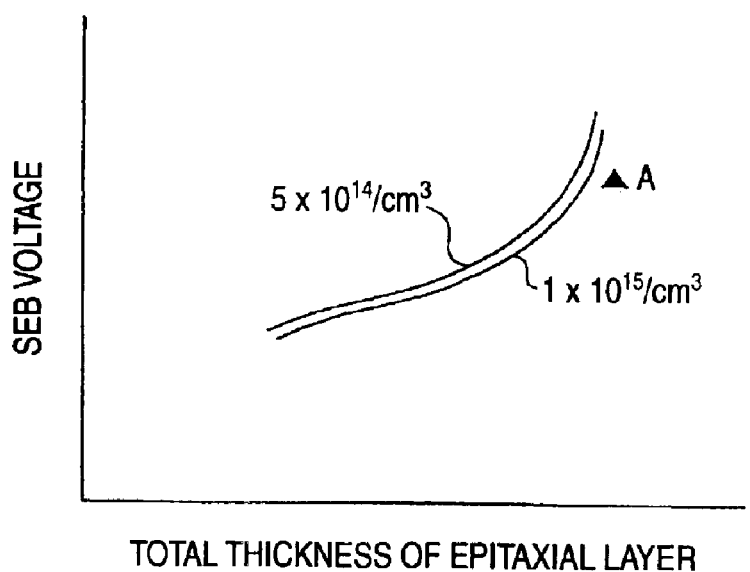
FIG. 4 is a cross sectional view showing an example of an arrangement of a vertical power MOSFET according to the invention.

In the following preferred embodiments according to the invention will be explained in detail with reference to the drawings. FIG. 4 is a cross sectional view showing an example of an arrangement of a vertical power MOSFET forming a semiconductor device according to the invention. The power MOSFET is provided with a first N⁻ base layer 22 as a first semiconductor region, a P base region 23 as a second semiconductor region and a P⁺ base region 23a with an impurity concentration higher than that of the P base region 23, an N⁺ source region 24 as a third semiconductor region, a second N base layer 3 as a fourth semiconductor region, an N⁺ drain layer 21 as a fifth semiconductor region, a gate insulator film 25, a gate electrode 26 as a first electrode, a source electrode 27 as a second electrode, and a drain electrode 28 as a third electrode.

The second N base layer 3 is deposited by epitaxial growth on an N⁺ semiconductor substrate to become the N⁺ drain layer 21. The first N⁻ base layer 22 is deposited by epitaxial growth on the second N base layer 3. The P and P⁺ base regions 23 and 23a are selectively formed in a surface portion of the first N⁻ base layer 22, respectively. The N⁺ source region 24 is selectively formed in a surface portion of the P base region 23. A channel region is formed in a surface region of the P base region 23 between the N⁺ source region 24 and the first N⁻ base layer 22. On the channel region, the gate insulator film 25 is formed, on which the gate electrode 26 is further formed. The source electrode 27 is formed in contact with the N⁺ source region 24 and the P⁺ base regions 23a in common. The drain electrode 28 is formed on the back of the N⁺ drain layer 21.

Here, the thickness and the impurity concentration of the N⁺ drain layer 21 are, for example, 320 $\mu$m and 2×10¹⁸/cm³, respectively. The thickness of the second N base layer 3 is equal to or more than ¼ of the thickness of the first N⁻ base layer 22. The averaged impurity concentration of the second N base layer 3 is between 1×10¹⁵/cm³ and 3×10¹⁷/cm³. Moreover, the thickness and the impurity concentration of the first N⁻ base layer 22 are, for example, 23 $\mu$m and 9×10¹⁴/cm³, respectively. Furthermore, the diffusion depth and the impurity concentration of the P base region 23 are, for example, 3.5 $\mu$m and 7×10¹⁷/cm³, respectively.

The diffusion depth and the impurity concentration of the N⁺ source region 24 are, for example, 0.2 $\mu$m and 2×10²¹/cm³, respectively. After the second N base layer 3 is deposited by epitaxial growth and further the first N⁻ base layer 22 is deposited thereon by epitaxial growth, the manufacturing process of the power MOSFET shown in FIG. 4 is the same as that of the power MOSFET shown in FIG. 1. Therefore, the detailed explanation thereof is to be omitted.

In FIG. 4, the thickness of the first N⁻ base layer 22, the thickness of the second N base layer 3, a thickness of a depletion layer necessary for securing the breakdown voltage of the device, a penetration depth of a cosmic ray, and a distance between an end of the N⁺ source region 24 and an end of the high concentration P⁺ base regions 23a are denoted as d1, d2, dmax, R, and ΔL, respectively. In the drawings of other examples according to the invention, the signs d1, d2, dmax, R, and ΔL, and illustration of the P⁺ base regions 23a are omitted for simplification of the drawings.

Figure 5:
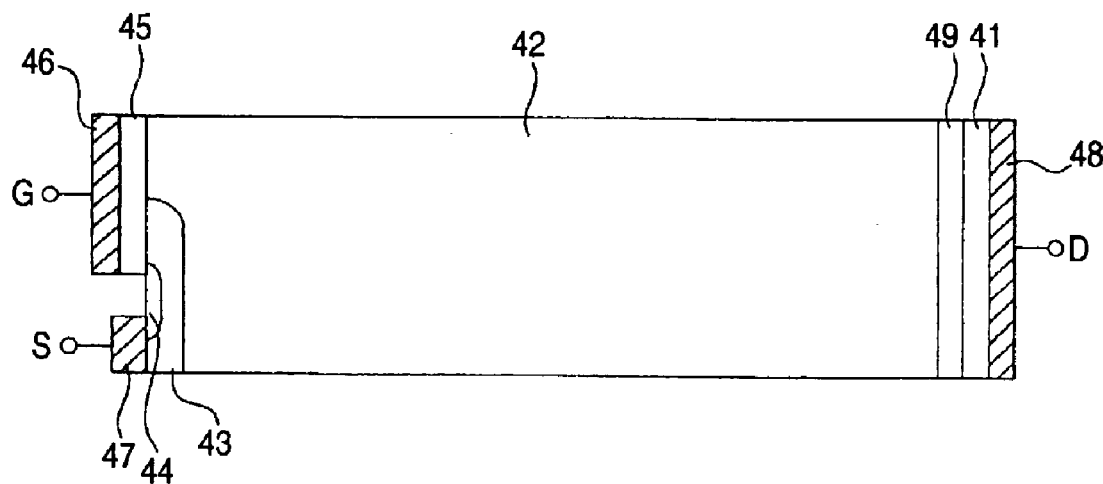
FIG. 5 is a cross sectional view showing an arrangement of an insulated gate bipolar transistor.

Incidentally, FIG. 5 shows an arrangement of an insulated gate bipolar transistor (IGBT). In thus arranged IGBT, for the purpose of reducing injection efficiency of holes from a drain layer 41 (a collector layer) or preventing punch-through at application of a high voltage, an N⁺ buffer layer 49 is provided on the drain side. The N⁺ buffer layer 49, like the second N base layer 3 in the embodiment, is provided between the drain layer 41 and an N⁻ drift layer 42 (equivalent to the first N⁻ base layer 22 in the embodiment). The second N base layer 3 in the embodiment, however, is a layer different from the N⁺ buffer layer 49. In the IGBT, the N⁺ buffer layer 49 is so thin as to have a thickness of only a several tenths of that of the N⁻ drift layer 42.

In addition, in FIG. 5, reference numerals 43, 44, 45, 46, 47, and 48 denote a base region, a source region (an emitter region), a gate insulator film, a gate electrode, a source electrode (an emitter electrode), and a drain electrode (a collector electrode), respectively.

Moreover, the power MOSFET in the embodiment differs from the MOSFET disclosed in JP-A-59-132671 or JP-A-60-196975 in the following. Namely, in the power MOSFET in the embodiment, the P base region 23 is formed within the first N⁻ base layer 22 without penetrating the first N⁻ base layer 22, that is, the P base region is not made to reach the second N base layer 3. Therefore, breakdown will occur at a diffusion corner of the P base region 23 where electric field strength is high.

Compared with this, in the MOSFET disclosed in JP-A-59-132671, a P-type well region (equivalent to the P base region 23 in the embodiment) penetrates an N⁻-type low doped region (equivalent to the first N⁻ base layer 22 in the embodiment) to reach an N⁺-type intermediately doped region (equivalent to the second N base layer 3 in the embodiment). Therefore, breakdown will occur at the bottom of the P-type well region.

Moreover, in the MOSFET disclosed in JP-A-60-196975, a P-type well region is provided which penetrates an N-type drain region (equivalent to the first N⁻ base layer 22 in the embodiment) deeper than a P-type channel region (equivalent to the P base region 23 in the embodiment) to reach an N-type impurity redistributed region (equivalent to the second N base layer 3 in the embodiment). Therefore, breakdown will occur at the bottom of the well region.

According to the above-explained embodiment, between the first N⁻ base layer 22 and the drain layer 21 of the N⁺ semiconductor substrate, the second N base layer 3 is provided with the thickness thereof equal to or more than ¼ of that of the first N⁻ base layer 22 and with the averaged impurity concentration thereof between 1×10¹⁵/cm³ and 3×10¹⁷/cm³. This makes the positive feedback hard to occur between the latch-up of a parasitic npn transistor and dynamic avalanche near the substrate, by which the SEB voltage can be enhanced. Thus, there can be obtained a power MOSFET which is provided with sufficient SEB voltage for being applied to space use. Furthermore, adequate selection of the thickness and the impurity concentration of the second base layer 3 can make the device provided so as not to cause damage due to SEB within a given breakdown voltage range. Therefore, a power MOSFET can be obtained which is free from causing damage due to SEB.

Figure 6:
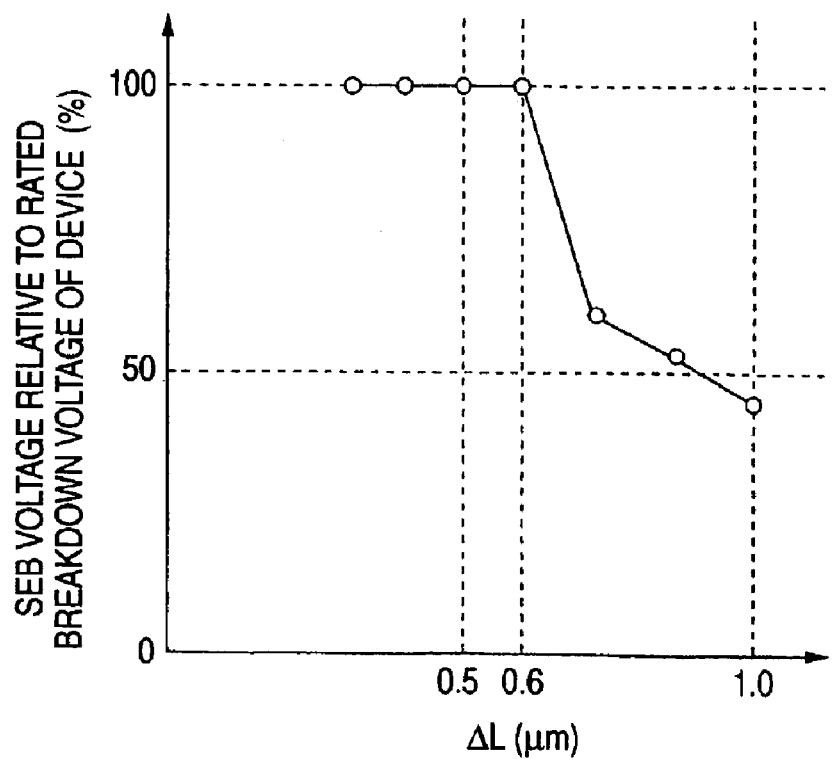
FIG. 6 is a cross sectional view showing an example of an arrangement of a lateral power MOSFET according to the invention.

In addition, the invention is not limited to the above-described vertical power MOSFET, but can be also applied to a lateral power MOSFET with such an arrangement as shown in FIG. 6. As shown in FIG. 6, in the lateral power MOSFET, a P base region 43 is selectively formed in a surface portion of a semiconductor substrate that is to become a first $N^-$ base layer 42. In a surface portion of the P base region 43, an $N^+$ source region 44 is further selectively formed. Moreover, in the same surface portion on the semiconductor substrate, apart from the P base region 43, there is selectively formed a second N base region 5, in a surface portion of which an $N^+$ drain region (a drain layer) 41 is selectively formed. A gate electrode 46 is provided on a channel region formed in the P base region 43 between the first $N^-$ base layer 42 and the $N^+$ source region 44 with a gate insulator film 45 held between the channel region and the gate electrode 46. A source electrode 47 is provided in contact with the $N^+$ source region 44 and the P base region 43 in common. A drain electrode 48 is provided in contact with the $N^+$ drain region 41. Furthermore, an insulator film 49 is provided on the back of the substrate Also in the lateral power MOSFET shown in FIG. 6, the width of the second N base region 5 is equal to or more than ¼ of the width of the first $N^-$ base layer 42, and the averaged impurity concentration of the second N base region 5 is between $1 \times 10^{15}/cm^3$ and $3 \times 10^{17}/cm^3$. Here, the width of the first $N^-$ base layer 42 is a lateral distance between the P base region 43 and the second N base region 5. Furthermore, the width of the second N base region 5 is a lateral distance between the first $N^-$ base layer 42 and the $N^+$ drain region 41. Impurity concentrations of other semiconductor layers and semiconductor regions are the same as those in corresponding layers and regions of the vertical power MOSFET shown in FIG. 4. Also in this case, a power MOSFET can be obtained which is provided with sufficient SEB voltage for being applied to space use.

Figure 7:
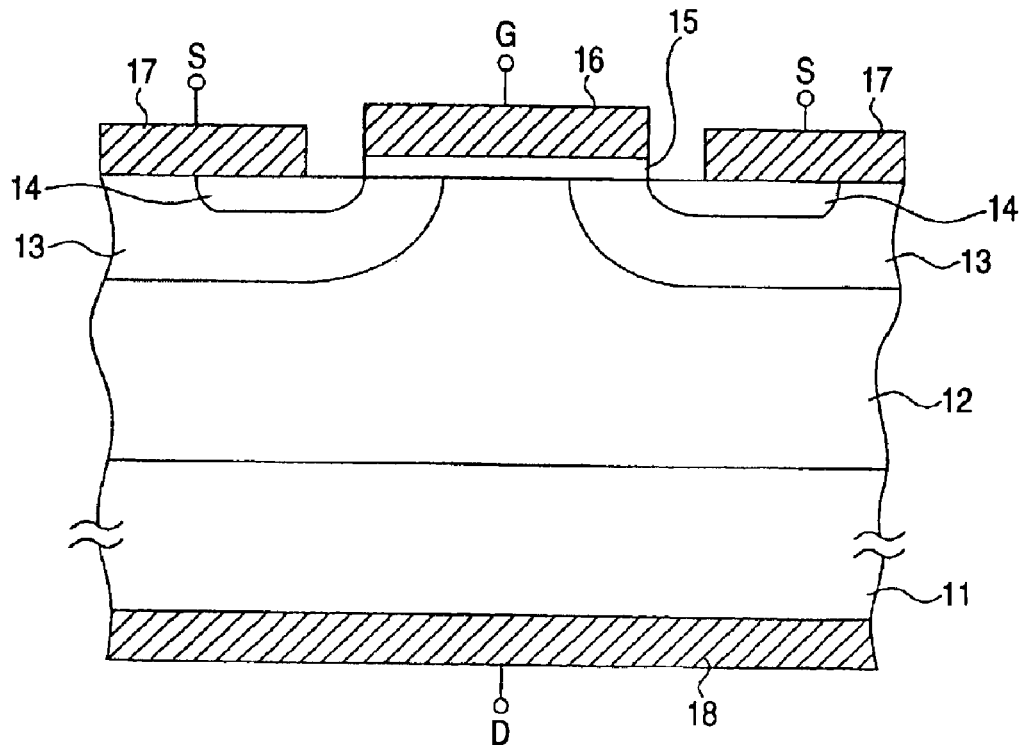
FIG. 7 is a cross sectional view showing an example of an arrangement of a trench power MOSFET according to the invention.

Moreover, the invention can be also applied to a trench power MOSFET with such an arrangement as shown in FIG. 7. As shown in FIG. 7, in the trench power MOSFET, a second N base layer 7 and a first $N^-$ base layer 62 are deposited in the order by epitaxial growth on a semiconductor substrate that is to become an $N^+$ drain layer 61. In a surface portion of the first $N^-$ base layer 62, there is formed a P base region 63, in a surface portion of which an $N^+$ source region 64 is selectively formed. Furthermore, in the $N^+$ source region 64, a trench is formed so as to reach the first $N^-$ base layer 62. On the inner face of the trench, there is formed a gate insulator film 65. The inside of the trench covered with the gate insulator film 65 is filled back with gate polysilicon which becomes a gate electrode 66. In contact with the $N^+$ source region 64 and the P base region 63 in common, there is provided a source electrode 67. In contact with the $N^+$ drain layer 61, there is provided a drain electrode 68.

Figure 1:
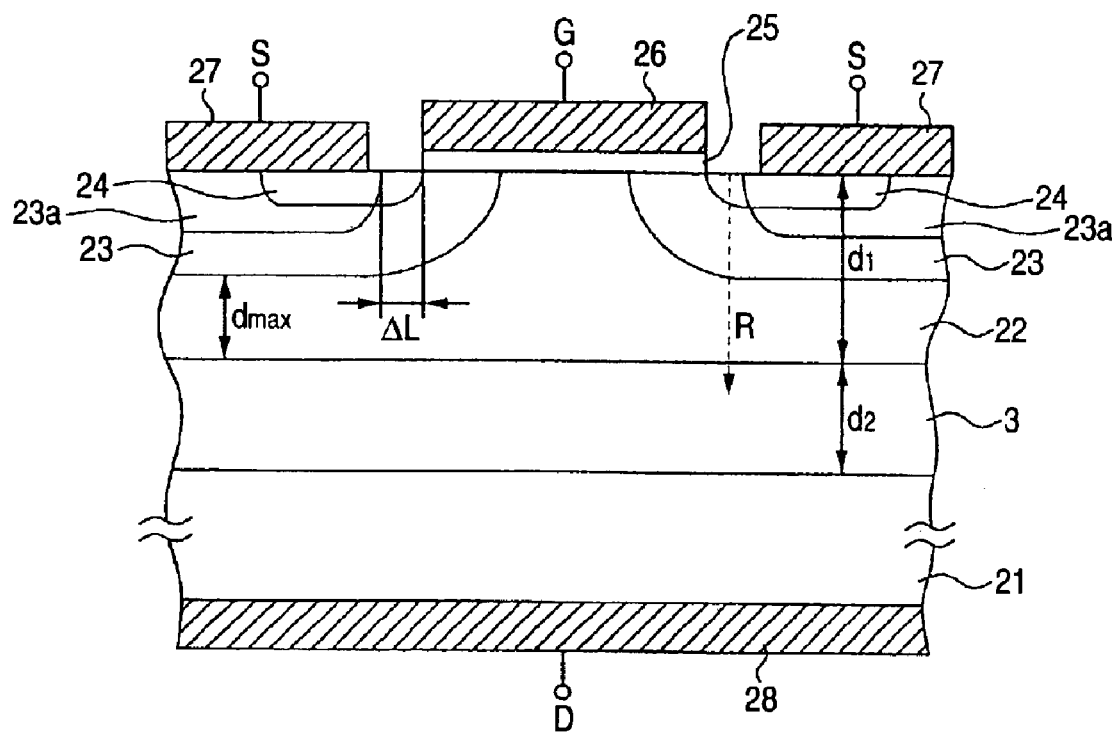
FIG. 1 is a cross sectional view showing an arrangement of a traditionally used n-channel power MOSFET.
Figure 2:
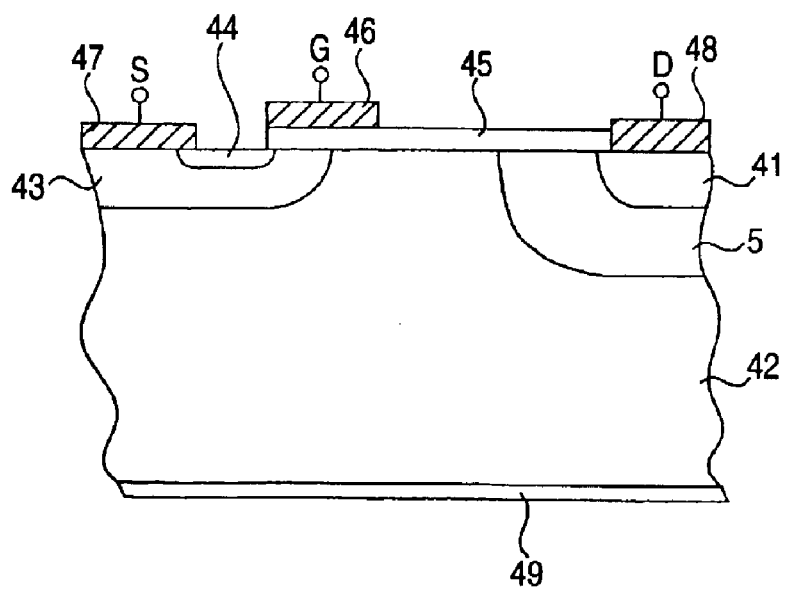
FIG. 2 is a characteristic diagram showing examples of respective current waveforms obtained by simulations with and without occurrence of SEB.
Figure 3:
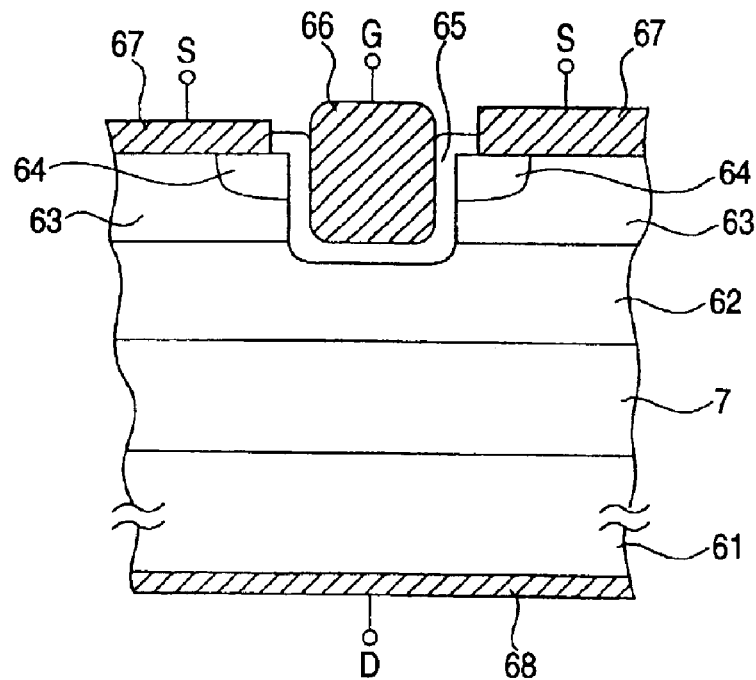
FIG. 3 is a characteristic diagram showing a relationship between a thickness of a total epitaxial layers obtained by simulation and SEB voltage.

In the trench power MOSFET shown in FIG. 1, the thickness of the second N base layer 7 is equal to or more than ¼ of the thickness of the first $N^-$ base layer 62. Moreover, the averaged impurity concentration of the second N base layer 7 is between $1 \times 10^{15}/cm^3$ and $3 \times 10^{17}/cm^3$. Impurity concentrations of other semiconductor layers and semiconductor regions are the same as those in corresponding layers and regions of the vertical power MOSFET shown in FIG. 4. Also in this case, a power MOSFET can be obtained which is provided with sufficient SEB voltage for being applied to space use.

In the foregoing, the invention can be modified without being limited to the above-explained embodiments. For example, in the above-described embodiments, the first and second conduction types were taken as n-type and p-type, respectively, but this can be reversed. Furthermore, the invention is not to be limited to the values of the thicknesses, depths, and impurity concentrations of the above-explained semiconductor layers and semiconductor regions.

Figure 8:
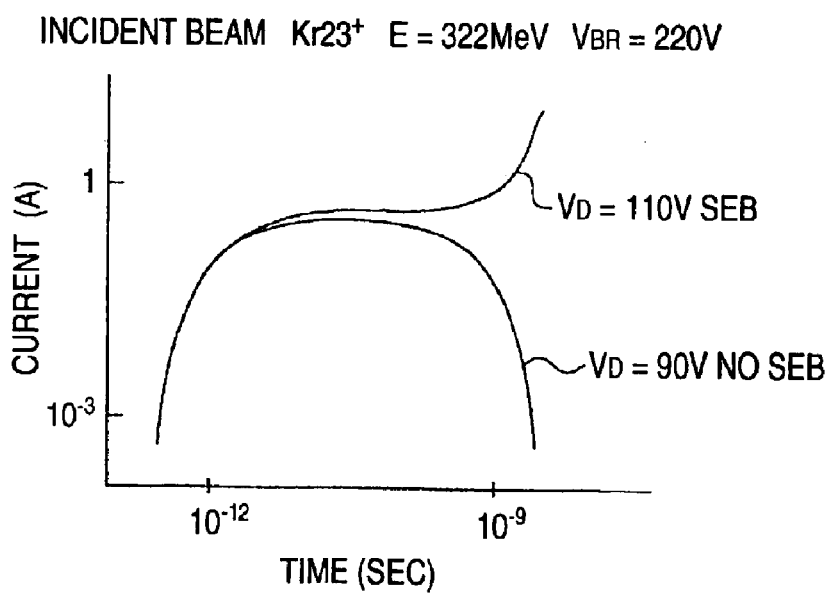
FIG. 8 is a characteristic diagram showing a relationship between SEB voltage relative to a rated breakdown voltage of the device and a distance of a channel region.

As another embodiment, there is one which makes an npn parasitic transistor itself hard to operate to make positive feedback also hard to be caused, thereby giving an effect of enhancing an SEB voltage. This will be explained by using FIG. 4 and FIG. 8. FIG. 8 is a characteristic diagram showing a relationship between SEB voltage relative to a rated breakdown voltage of the device and a distance between an end of the $N^+$ source region 24 on the gate insulator film 25 side and an end of the $P^+$ base region 23a on the gate insulator film 25 side in FIG. 4, that is, a distance $\Delta L$ on the surface of the channel region.

As shown in FIG. 8, within a range of $\Delta L \leq 0.6$ μm, the SEB voltage can be secured up to the rated breakdown voltage of the device. Namely, when the distance $\Delta L$ on the surface of the channel region is equal to or less than 0.6 μm, a forward bias voltage between the $N^+$ source region 24 and the P and $P^+$ base regions 23 and 23a becomes small. The forward bias voltage is due to holes produced by dynamic avalanche near the substrate and flowing in the P and $P^+$ base regions 23 and 23a. This makes the parasitic transistor hard to operate. As a result, the SEB voltage can be secured up to the rated breakdown voltage of the device.

Figure 9:
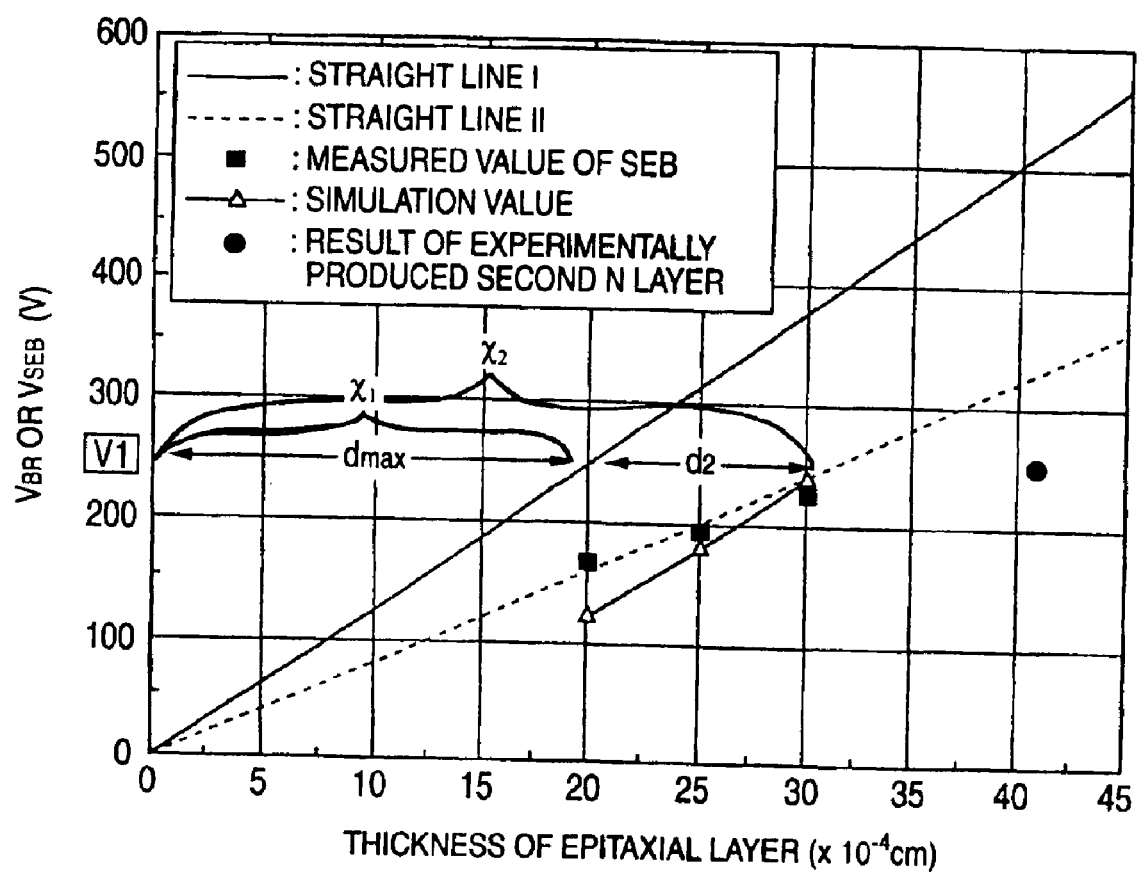
FIG. 9 is a diagram showing relationships between a breakdown voltage $V_{BR}$ and a thickness of an epitaxial layer, and between SEB voltage $V_{SEB}$ and a thickness of the epitaxial layer.

As further another embodiment, the thickness d2 of the second N base layer 3 is determined also by the following. FIG. 9 is a diagram showing relationship between a breakdown voltage $V_{BR}$ of a device and a maximum width of a depletion layer, and relationship between an SEB voltage $V_{SEB}$ and a thickness of an epitaxial layer. In FIG. 9, a straight line I shows a relationship between an actual breakdown voltage V1 in volts obtained on the basis of the breakdown voltage $V_{BR}$ of the device given by the expression (3) and a maximum width of a depletion layer d ($d_{max}$) in μm at that time, and is given as $$d_{max} = V1/12.5 \quad (5)$$

A straight line II shows a relationship between the SEB voltage $V_{SEB}$ in volts and the thickness of the N base layer 3 in μm determined on the basis of fitting with measured results. Results of simulation are also shown in FIG. 9. The SEB voltage $V_{SEB}$ increases with an increase in the thickness of the N base layer 3 (($d_{max}+d2)-d_{max}$, that is, d2). The straight line II can be approximated by the expression as $$(d_{max}+d2) = V_{SEB}(V)/8 \quad (6)$$

Thus, the thickness of the second N base layer 3 is determined as follows. First, a necessary breakdown voltage of the device V1 is given to determine the thickness $d_{max}$ (the maximum width of the depletion layer shown in FIG. 4) from the straight line I. The thickness $d_{max}$ is equal to a thickness for which the thickness of the P base region 23 is subtracted from the thickness of the first $N^-$ base layer 22. Next to this, from the straight line II, a thickness $d_{max}+d2$ as a total of the $d_{max}$ and the thickness of the N base layer 3 in μm when the necessary breakdown voltage of the device V1 is applied. By obtaining the difference of the $d_{max}$ and $d_{max}+d2$, the thickness d2 can be calculated out. A thickness equal to or more than one-half of the thickness d2 in μm is practically sufficient. Furthermore, the on-resistance Ron is determined by an amount of impurity and a thickness of each of the first N⁻ base layer 22 and the second N base layer 3. Therefore, the upper limit of the thickness of each of the layers is determined in relation to the desired on-resistance. By using the second N base layer 3 with the thickness thereof thus determined, there can be actualized a practical MOSFET for space use without degrading on-resistance Ron while enhancing the SEB voltage $V_{SEB}$ within a range of the necessary breakdown voltage V1 of the device.

According to the invention, positive feed back becomes hard to occur between the latch-up of a parasitic npn transistor and dynamic avalanche near the substrate, by which the SEB voltage can be enhanced. Thus, a power MOSFET can be obtained which is provided with sufficient SEB voltage for being applied to space use.

While the invention has been particularly shown and described with reference to preferred embodiments thereof, it will be understood by those skilled in the art that the foregoing and other changes in form and details can be made therein without departing from the spirit and scope of the invention.

What is claimed is:

1. A semiconductor device comprising:

a first semiconductor region of a first conduction type with a relatively low impurity concentration, the first semiconductor region mainly determining a breakdown voltage of the device;

a second semiconductor region of a second conduction type selectively provided in a surface portion of the first semiconductor region;

a third semiconductor region of the first conduction type with a high impurity concentration selectively provided in a surface portion of the second semiconductor region;

a high impurity region of the second conduction type covering a part of the third semiconductor region of the first conduction type with the high impurity concentration in the second semiconductor region;

a fourth semiconductor region of the first conduction type with an impurity concentration higher than that of the first semiconductor region, the fourth semiconductor region being provided in contact with the first semiconductor region and apart from the second semiconductor region;

a fifth semiconductor region of the first conduction type with an impurity concentration higher than that of the fourth semiconductor region, the fifth semiconductor region being provided in contact with the fourth semiconductor region and apart from the first semiconductor region;

an insulator film provided along a channel region formed in the second semiconductor region between the first semiconductor region and the third semiconductor region;

a first electrode holding the insulator film between the channel region and the first electrode;

a second electrode in contact with the third semiconductor region and the second semiconductor region in common; and a third electrode in contact with the fifth semiconductor region, wherein, with respect to a linear expression $x_1(d_{max})=V1/12.5$ about a breakdown voltage V1 of the first semiconductor region mainly determining the breakdown voltage of the device and a maximum width $x_1(d_{max})$ of a depletion layer thereof, and a linear expression $x_2(d_{max}+d2)=V_{SEB}/8$ about a single event burnout (SEE) voltage $V_{SEB}$ from cosmic rays radiation hardness of the fourth semiconductor region and a thicness $x_2(d_{max}+d2)$ from the depletion layer with the maximum width $x_1(d_{max})$ to the fourth semiconductor region (where V1 and $V_{SEB}$ are in volts, and $x_1(d_{max})$ and $x_2(d_{max}+d2)$ are in μm), with values of $x_1(d_{max})$ and $x_2(d_{max}+d2)$ satisfying $V1=V_{SEB}$, the fourth semiconductor region has a thickness given as being equal to or more than one-half of $x_2-x_1$, and has an averaged impurity concentration between $1\times10^{15}/cm^3$ and $3\times10^{17}/cm^3$.

2. The semiconductor device as claimed in claim 1 wherein a distance ΔL between an end of the third semiconductor region in a surface portion of the channel region and an end of the high impurity region covering a part of the third semiconductor region in the second semiconductor region is equal to or less than 0.6 μm.

3. The semiconductor device as claimed in claim 1 or claim 3 wherein the semiconductor device is a planar type of MOSFET.

* * * * *

UNITED STATES PATENT AND TRADEMARK OFFICE
CERTIFICATE OF CORRECTION

PATENT NO. : 6,885,063 B2
DATED : April 26, 2005
INVENTOR(S) : Tagami et al.

It is certified that error appears in the above-identified patent and that said Letters Patent is hereby corrected as shown below:

Column 10,
Line 28, please delete "thicness" and insert therefor -- thickness --.

Signed and Sealed this

Ninth Day of August, 2005

JON W. DUDAS
*Director of the United States Patent and Trademark Office*